United States Patent [19]
Huang et al.

[11] Patent Number: 5,801,108
[45] Date of Patent: Sep. 1, 1998

[54] LOW TEMPERATURE COFIREABLE DIELECTRIC PASTE

[75] Inventors: Rong-Fong Huang, Albuquerque; Carlos A. Sanchez, Belen; James H. Lombard, Albuquerque, all of N. Mex.

[73] Assignee: Motorola Inc., Schaumburg, Ill.

[21] Appl. No.: 716,785

[22] Filed: Sep. 11, 1996

[51] Int. Cl.$^6$ .................. C03C 4/16; C03C 14/00
[52] U.S. Cl. .................. 501/32; 5015/5; 5015/17; 5015/20; 5015/136
[58] Field of Search .................. 501/5, 17, 32, 501/20, 136

[56] References Cited

U.S. PATENT DOCUMENTS

| | | | |
|---|---|---|---|
| 3,673,092 | 6/1972 | Dietz | 501/32 |
| 3,720,862 | 3/1973 | Mason | 501/32 |
| 3,778,285 | 12/1973 | Mason | 501/32 |
| 3,785,837 | 1/1974 | Amin | 501/8 |
| 3,787,219 | 1/1974 | Amin | 501/32 |
| 3,848,079 | 11/1974 | Amin | 501/8 |
| 4,612,600 | 9/1986 | Hodgkins | 361/321 |
| 5,028,473 | 7/1991 | Vitriol et al. | 428/137 |
| 5,075,818 | 12/1991 | Ueno et al. | 361/321 |
| 5,102,720 | 4/1992 | Raj | 521/209 |
| 5,141,899 | 8/1992 | Jean et al. | 501/18 |
| 5,144,526 | 9/1992 | Vu et al. | 361/321 |
| 5,247,523 | 9/1993 | Arai et al. | 371/37.4 |
| 5,256,469 | 10/1993 | Cherukuri et al. | 428/210 |
| 5,270,268 | 12/1993 | Jean et al. | 501/32 |
| 5,312,674 | 5/1994 | Haertling et al. | 428/210 |

FOREIGN PATENT DOCUMENTS

| | | | |
|---|---|---|---|
| 0417992A2 | 7/1990 | European Pat. Off. | H01L 23/538 |

*Primary Examiner*—Karl Group
*Attorney, Agent, or Firm*—Gary J. Cunningham; Colin M. Raufer

[57] ABSTRACT

A dielectric paste material may be used in the fabrication of multilayered ceramic modules to create circuit elements. The dielectric paste is a multiphase material in which at least one phase is an alkaline earth metal, transition metal silicate. This yields a dielectric paste with extremely good K & Q values suitable for high frequency applications which significantly reduce manufacturing costs of modules.

4 Claims, 3 Drawing Sheets

LOW TEMPERATURE COFIREABLE DIELECTRIC PASTE

FIELD OF THE INVENTION

This invention relates to dielectric pastes for electronic applications. More specifically, this invention relates to a low-temperature co-firable dielectric paste for high frequency ceramic multilayer modules and a method for fabricating the same.

BACKGROUND OF THE INVENTION

The use of multilayer ceramic packages as a method of routing electronic circuitry is well known in the industry. Traditionally, electronic components such as capacitors and resistors are screen-printed onto multiple layers of ceramic green tape which are then laminated to form dense ceramic packages. The processes involved in the fabrication of multilayer ceramic packages can be expensive, time consuming, and labor intensive.

The green ceramic tapes used in the multilayer industry usually come in one of two forms. The first, alumina tapes, must typically be sintered at elevated temperatures of approximately 1600° C. These tapes usually require a high temperature metal composition such as tungsten to form their conductive paths inside the multilayer packages. However, due to the high electrical resistivity of tungsten, these types of packages are generally not suitable for radio frequency (RF) applications. The second option for ceramic green tape involves using a lower temperature glass-loaded alumina composition which sinters at a lower temperature of approximately 850° C. These tapes typically use a silver paste to form the conductive paths inside the multilayer packages. One example of the latter type of tape would be Dupont Green Tape®. Due to the high conductivity of silver, these types of packages are suited to wireless communication applications.

The cost of manufacturing multilayer ceramic packages is often directly related to the number of layers of tape found in the packages. Typically, the larger the number of layers of tape in a package, the more expensive, labor intensive, and time consuming the resulting production processes will be. On the other hand, it may also be necessary to maintain a predetermined thickness for the completed multilayer package so that certain integrated components such as transmission time can exhibit low loss properties at RF frequencies. Also, it may be critical that certain predetermined dimensions separate the electronic components within the multilayer package itself. Thus, there is an incentive to reduce the number of layers in a multilayer package while maintaining the overall thickness of the package by using thicker tapes because this can translate into lower manufacturing costs. However, it is difficult to obtain desired capacitance when thicker tapes are used to form capacitors in the multilayered package.

The electrical properties found in commercial dielectric pastes are better suited for the hybrid industry where high frequency loss is not a concern. For example, the "RF" design industry is also very interested in the electrical property "Q", which can be defined as a dimensionless property which is inversely related to the loss factor of a given material. High electrical Q values, critical in many RF design applications, are typically not present in current dielectric pastes.

Another area of concern for RF design engineers involves the electrical dielectric constant (K) values of dielectric pastes. Present day dielectric pastes used in hybrid circuitry tend to be much higher than is required for many RF design applications. From an electrical point of view, multilayer ceramic packages need to be redesigned in order to be useful to the field of RF design. More specifically, the RF design industry will require electrical Q values greater than 500 and dielectric constant (K) values of between about 20 and 60.

Other United States patents have been issued which describe compositions that can be used in conjunction with green, i.e., unfired, ceramic tape materials, however, the compositions of these other patents have been formulated to achieve other objectives. For example, U.S. Pat. No. 4,533,974 entitled "Low-Firing High Q Monolithic Ceramic Capacitor," to Maher describes a low fire ceramic composition in which the electrodes are made from a different metal system. U.S. Pat. No. 5,144,526 entitled "Low Temperature Co-Fired Ceramic Structure Containing Buried Capacitors" to Vu et al. describes a dielectric paste in a multilayer package, but fails to describe sintering temperatures and specific materials. The above mentioned patents do not describe a dielectric paste which can be placed into a multilayer ceramic system and can drastically reduce the number of layers required to achieve a module which can meet design specifications unique to the RF design industry.

Accordingly, there is a need for low temperature, co-firable dielectric paste for high frequency multilayer ceramic modules. Such a paste should reduce the number of layers ceramic material requirements in multilayered packages, while offering high Q, high dielectric constant (K) values.

DETAILED DESCRIPTION OF THE PREFERRED EMBODIMENT

Figure 1:
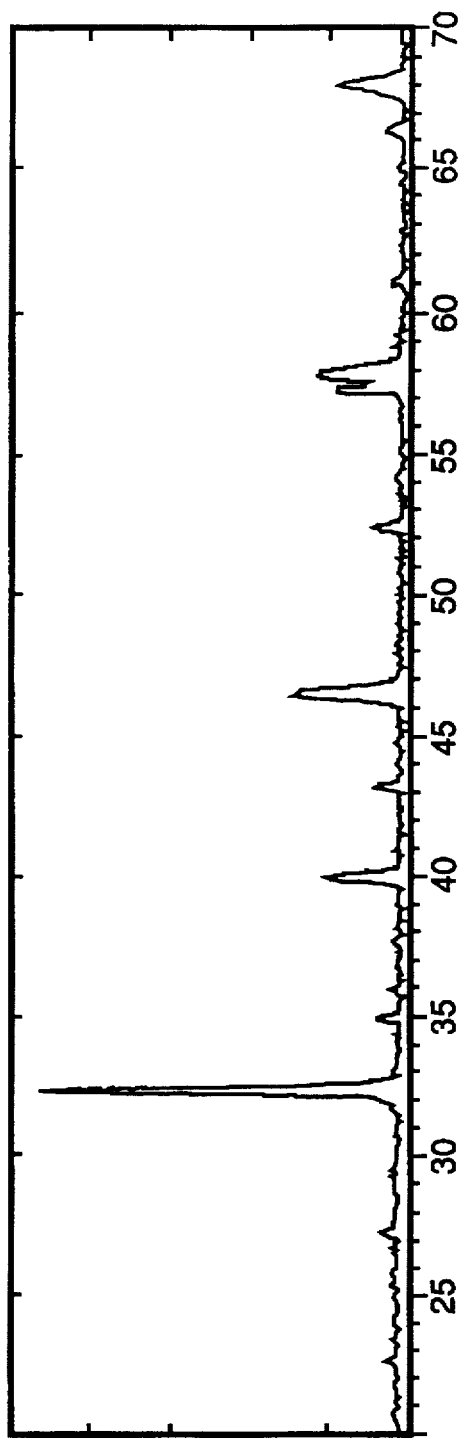
FIG. 1 shows a graph of the crystalline phases present in the dielectric paste before firing to 850° C. in accordance with the present invention.

While the specification concludes with claims defining the features of the invention that are regarded as novel, it is believed that the invention will be better understood from a consideration of the following description in conjunction with the drawing figures, in which like reference numerals are carried forward.

The invention relates to a dielectric paste for the fabrication of multilayer ceramic modules which contain circuit elements such as, for example, capacative and inductive circuits, for use in among other things, RF design industry applications. The desired dielectric paste possesses ideal electrical properties such as a dielectric constant (K) of approximately between 20 and 60 and preferably about 25 and an electric Q property greater than approximately 500, particularly at RF frequencies of about 500 MHz. The paste is cofireable with ceramic green tape at temperatures of approximately 850° C. Finally, the paste has a particle size and solids content that allows it to be screen printable using conventional techniques.

The dielectric paste has a dielectric constant between 20 and 60 so that localized areas of high capacitance can be created, resulting in ceramic multilayer packages which have both capacitors and inductors in the same device. If electronic components such as capacitors that require a high dielectric constant (K) material could be placed in the same package as other electronic components, such as transmission lines that require a low dielectric constant material, in a manner that required fewer layers of tape, great savings and costs in manufacturing complexity could be achieved. Critical to achieving this result would be the formulation of a dielectric paste with a high dielectric constant that could be easily screen printed in a very thin layer, between the layers of low dielectric constant tape in a multilayer ceramic package.

The range for K of between 20 and 60 is chosen because the dielectric constant less than about 20 results in a large printed area so as to form a capacitor inside the ceramic multilayered package. A K value greater than 60 would conversely require an extremely small printed area in which to form the capacitor. Although such a small printed area maybe easily produced, it may also be sensitive to processing variations.

The capacitance of a capacitor embedded in a multilayered package is related to the dielectric constant of a dielectric material and the thickness of the dielectric layer according to the following equation:

$$C=(eNAK)/t$$

where C is the capacitance of the capacitor inside the multilayer ceramic package; e is a constant; N is the number of active layers used to build the multilayered ceramic package; K is the dielectric constant of the dielectric paste; A is the area of the electrodes; and t is the thickness or distance between the capacitor plates in the multilayered package.

Closer analysis of this equation reveals that if the value of A is constant, a desired capacitance can be achieved by adjusting either the number of active layers N or the ratio of K/t. For traditional multilayer packages, the K value is small and the t is large (green tapes are typically approximately 0.045" thick, with a K of 7.3). Thus, for traditional multilayered packages, the ratio of K/t is usually very small. In order to achieve a predetermined capacitance (C) value, N must be large, i.e., many layers are required to build the capacitor. However, by using a dielectric paste having a K value of about 25, as described hereinbelow, and applying this dielectric paste in very thin layers, (dielectric paste may be applied in layers approximately 0.0005–0.0007 inches thick.) It is evident that the ratio of K/t can be much larger in a package with dielectric paste layers than in traditional multilayer ceramic packages. Thus, a multilayer package using this dielectric paste can employ fewer active layers, resulting in reduced costs and processing steps.

Creating a dielectric paste that is compatible with the other materials systems present in the ceramic multilayer package is a priority. Compatibility is essential in order to avoid a host of processing problems. One compatibility concern involves compatibility of the glass composition present in the dielectric paste with the green ceramic tape material. Adverse chemical reactions occurring at the paste tape interface may result in blow-outs, cracks, and the unwanted formation of other phrases to name but a few.

An additional important factor in the formulation of the dielectric paste is the need to match the shrinkage between the green tape and the dielectric paste upon firing. Since smaller grain powders tend to shrink more on firing, an optimum particle size must be determined through repeated testing. Ultimately, a preferred particle size range was determined for this dielectric paste. Once the particle size was determined, the rheology also is to be controlled. In order to use the dielectric paste in a production environment, the proper solids loading content had to be determined which would allow the composition to be screen printed. These desirable characteristics must be obtained while maintaining all previously described properties.

In light of the requirements for the dielectric paste described above, the inventors created a paste from starting materials consisting of dielectric powder composition, a glass composition which will react with the dielectric powder upon firing and partially form a crystallized phase, and a binding material such as an organic binder. The resulting dielectric paste is a multiphased, dielectric paste wherein at least one phase is an alkaline earth, transition metal silicate.

The dielectric powder starting material chosen for this dielectric paste is selected from the group of materials consisting of barium calcium titanate, barium strontium titanate, calcium magnesium titanate, strontium calcium titanate, and combinations thereof. In one preferred embodiment, the dielectric powder is strontium calcium titanate (SrCa)TiO$_3$. These materials were chosen for their electrical properties which were within the desired parameters. The K value for these materials is approximately 250 and the Q value is greater than about 1,000 at frequencies in the range of approximately 500 mHz. The densification temperature of these materials is approximately 1280° C.

Strontium calcium titanate composition was chosen for this dielectric paste and has been previously disclosed and claimed in commonly assigned U.S. Pat. No. 4,992,398 entitled "High Frequency Dielectric Composition", to Huang, et al.; and U.S. Pat. No. 5,019,306 entitled "High Frequency Dielectric Composition", also to Huang, et al, the disclosures of which are incorporated herein by reference.

The recrystallizable glass reactable with the dielectric power selected for this composition was a calcium lead borosilicate glass which has a softening point of approximately 500°–600° C. Other examples of crystallizable glass include niobium lead silicate, aluminum lead borosilicate, zinc lead borosilicate, barium lead borosilicate, and combinations thereof. Regardless of the crystallizable glass used in the formulation of this dielectric paste, the weight ratio of the dielectric powder to the crystallizable glass must be carefully controlled to yield an acceptable densification temperature. As will be described in greater detail below, when the dielectric powder to crystallizable glass ratio is approximately 60–40 wt %, then the resulting mixture will densify at approximately 850° C.; an ideal temperature for a cofireable dielectric paste. The fact that the glass used in this dielectric paste composition can react with the dielectric powder upon firing, and crystallize to a calcium titanate silicate phase is also important. Most traditional glasses which are not reactable with the dielectric powder and partially for a crystallized phase, tend to have low K, and very low Q values, in the range of less than 200. It is the reactable, crystallizable nature of the glass used in this system which accounts for the high Q properties critical for use in the RF industry.

The organic binder material added to the combination of dielectric powder and crystallizable glass consist of a polymer dissolved in at least one, and preferably several solvents. The polymer used in the organic binder may be any of those known in the art, and in one preferred embodiment may be ethyl cellulose. Although acceptable polymers include other cellulose polymers of various molecular weights and grades, examples of which include methyl cellulose, nitrocellulose, and combinations thereof.

The polymer is dissolved in the combination of different solvents so as to provide different drying times for the polymer, since different solvents evaporate at different rates. Using more than one solvent also allows the polymer to dissolve more quickly and easily. In one preferred embodiment, the solvents used to dissolve the polymer include alpha-terpineol, ester alcohol, and diethylene glycol monobutyl ethyl. Other solvents which may be used include, but are not limited to, terpineols such as betaterpineol, isopropanol, and combinations thereof.

The organic binder may further include plasticizers adapted to enhance the mechanical properties thereof. Examples of preferred plasticizers include dioctylphthlate, dibutylphthlate and other phthlates. Also included in the organic binder may be antioxidation elements provided to preserve the polymer. That is, as the polymer is suspended in the solvents, the solvents have a tendency to oxidize or otherwise degrade the polymer itself. Accordingly, antioxidants are added in order to avoid degradation of the polymer. Examples of preferred antioxidant materials include butylated hydroxyl toluene (BHT).

The organic binder may further include dispersion elements and thickening agents to enhance the properties of the dielectric pastes. Dispersants such as a methyl quantanary of propoxylated diethylethanolamine such as EMCOL cc-42 or lipophilic acid neutralized complex amines such as witcamine may be added to the mixture to enhance the dispersion of the particles therein. The thickening agents maybe one of several known in the art, and include amorphous colloidal silicon dioxide known in the industry as cabo-sil, finely divided powder organic derivatives of castrol oil such as glyceryl tris hydroxyl stearate (thix cin-A) and rheological additives i.e. organically modified hectorite clay such as Bentone 128.

An optimal blend for the organic binder was found to be ethyl cellulose (4–8 wt %), ester alcohol (0.5–12 wt %), diethylene glycol monobutylether (0–20 wt %), dioctylphthlate (0–20 wt %), and abutylated hydroxytoluene (0–5 wt %), with balance being alpha terpenol. Viscosity modifiers added to the composition include a Bentone 128 (about 5.5 wt %) and THixin E thickener (about 2.0 wt %). Viscosity modifers and thickeners were found to be helpful in the range of 0.6 wt % in total in addition to the paste to achieve the desired viscosity level. Prior to firing in a kiln, the ratio of dielectric powder and crystallizable glass and binder is between 60–80 wt %. Further, the dielectric powder is between 50–80 wt % of the dielectric powder/crystallizable glass mixture. The optimum particle size of the solid portion is between 1.0 and 2/5 µm.

Employing the dielectric powder crystallizable glass, and organic binder, all as described hereinabove, it is possible to provide a dielectric paste which can be easily screen printed on the stainless steel mesh screen over the ceramic green tape composition and then cofired in an air atmosphere at approximately 850°.

Using the dielectric powder, crystallizable glass, and organic binder starting materials as described hereinabove, and wherein said starting materials are provided in relative proportion on one another as described hereinabove, the material resulting from said mixture after firing is a multiphased dielectric paste wherein at least one phase is an alkaline earth metal transition metal silicate. More particularly, alkaline earth metal transition metal silicate consists of an alkaline earth metal selected from the group of calcium, barium, strontium, magnesium and combinations thereof. The transition metal element is selected from the group of titanium, zirconium, niobium, zinc, and combinations thereof. Accordingly, and in one preferred embodiment, the alkaline earth metal transition metal silicate phase is a calcium titanium silicate phase formed in the dielectric paste.

The resulting multiphased dielectric paste may similarly have a second phase which is a borosilicate phase. The borosilicate which comprises the borosilicate phase may be for example, a calcium lead borosilicate, a niobium lead borosilicate, a barium lead borosilicate, an aluminum lead borosilicate, a zinc lead borosilicate and combinations thereof. A third phase of which the multiphase dielectric paste may be comprised is a titanate phase and particularly a titanate phase including an alkaline earth metal. Examples of the titanate phase in the multiphase dielectric paste include strontium calcium titanates, barium calcium titanates, calcium magnesium titanates, barium strontium titanates, and combinations thereof.

Figure 2:
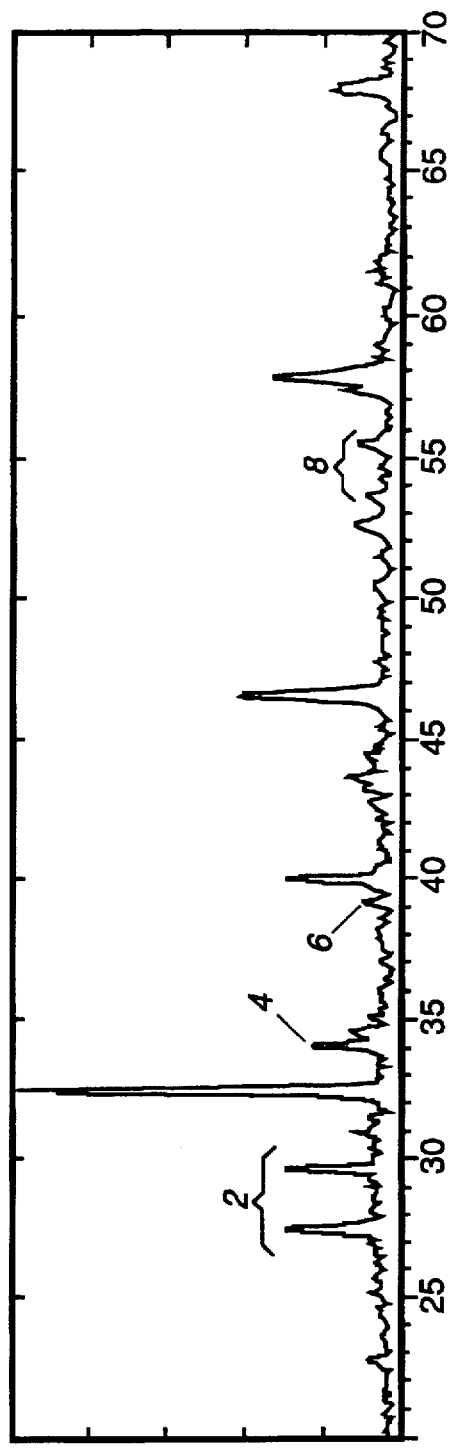
FIG. 2 shows a graph of the crystalline phases present in the dielectric paste after firing to 850° C., in accordance with the present invention.

Referring now to FIGS. 1 and 2, there is illustrated therein the x-ray diffraction patterns of the dielectric paste both before (FIG. 1) and after (FIG. 2) firing at temperatures of about 850° C. The presence of new crystalline phases of calcium titanium silicate, identified by peaks 22, 4, 6, 10, confirm that the crystallizable glass in the system reacts with the dielectric, and crystallize into a new phase after firing.

Figure 3:
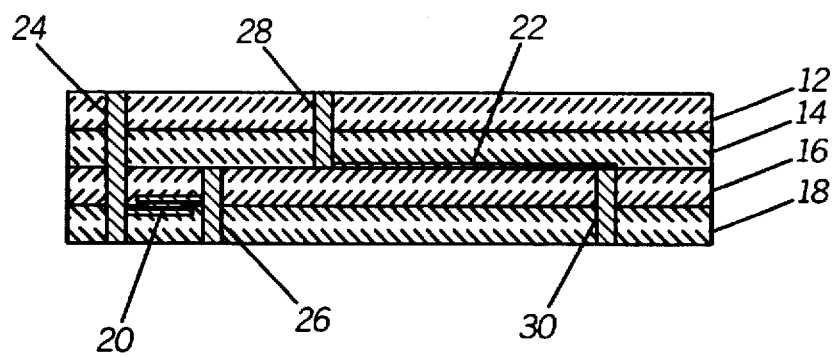
FIG. 3 shows a cross-sectional view of a multilayer ceramic module in accordance with the present invention.
Figure 4:
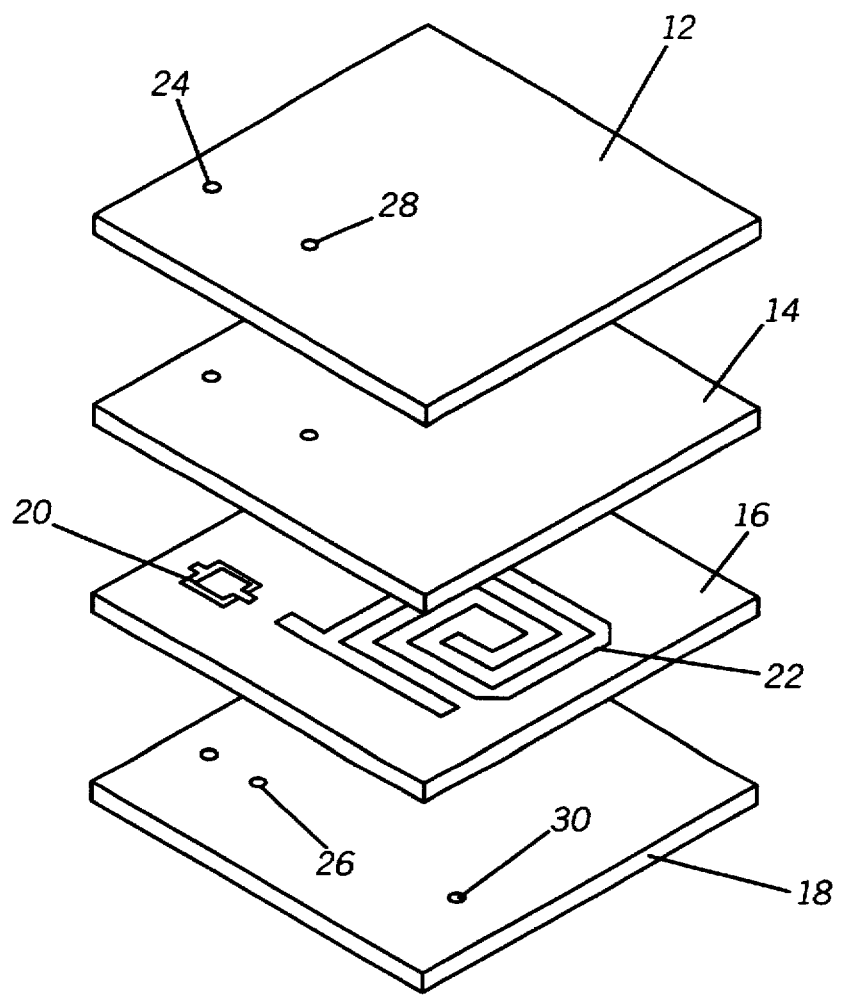
FIG. 4 shows an exploded view of the multilayer ceramic module of FIG. 1 in accordance with the present invention.

Referring now to FIGS. 3 and 4, there is illustrated therein, a cross-sectional side view and an exploded view of a multilayered ceramic module employing a dielectric paste in accordance with the instant invention. The module 10 is comprises of a plurality of layers of ceramic materials 12, 14, 16, and 18, each of said materials being fabricated of ceramic materials as are well known in the art. Formed in and between the layers may be a plurality of electrical circuit elements such as elements 20 and 22 in FIG. 3. More particularly, element 20 may be, for example, a capacitor device, while element 22 may be a transmission line or induction. Electrical communication is made between the circuit elements 20 and 22 and the external regions of the module 10 by forming a plurality of vias 24, 26, 28 and 30 on layers of ceramic material, in a manner such that the vias are disposed one atop the other. Electrical communication is affected by disposing electrically conductive material such as, for example, silver, in the vias and on electrical conductive lead lines up to the circuit elements 20 and 22. While the electrical elements illustrated in FIGS. 3 and 4 are a capacitor and an inductor, it is to be understood that any type of electrical circuit may be employed in connection with the instant invention. However, in an effort to better understand the instant invention, the capacitor element 20 illustrated in FIGS. 3 and 4 will be described hereinbelow with respect to FIG. 5.

Figure 5:
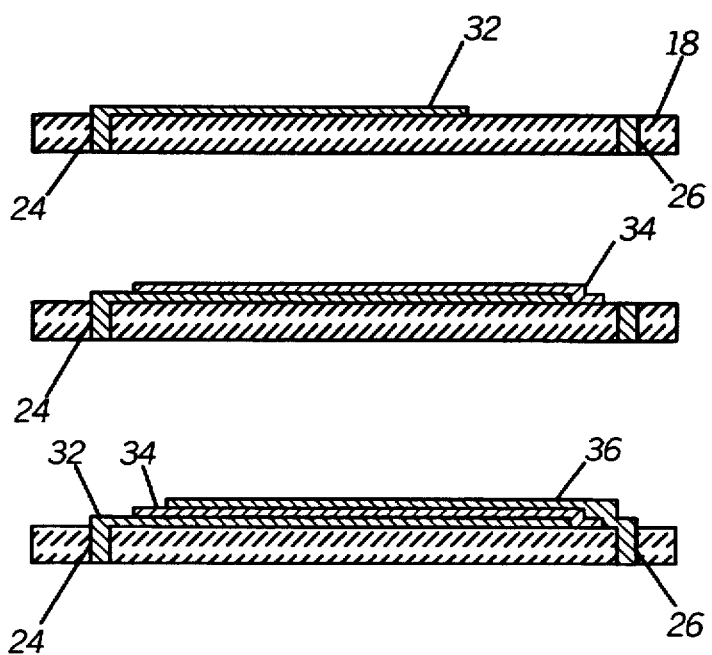
FIG. 5 illustrates the processing steps to manufacture the multilayer ceramic module in accordance with the present invention.

Referring now to FIG. 5 there is illustrated therein the steps for forming capacitor device illustrated in FIG. 3 and 4. By using the dielectric paste material described above, it may be appreciated from FIGS. 3 and 4, that the layer of ceramic materials illustrated in FIG. 5 is layer 18. Formed through layer 18 and illustrated in FIG. 5 are vias 24 and 26, as well as an electrode layer 32, each of which vias and the electrode layer being fabricated of a deposited electrically conductive material including for example, silver, nickel, copper, gold, silver, platinum, and combinations thereof. In a preferred embodiment, the electrically conductive material formed in the vias and used to form the electrode layer 32 is silver due to its preferred thermal firing characteristics.

That is, silver fires at 850° C. (the temperature at which the dielectric paste and the ceramic tape fire) without significant shrinkage, and with a close thermal expansion of both the dielectric paste and the ceramic tape.

Disposed atop the electrode layer 32 is a layer of the dielectric paste material described hereinabove. As noted above, the dielectric paste has an electrical dielectric constant value of greater than about 20 and an electrical Q value of greater than about 500. An advantage that this provides in fabricating devices such as that illustrated in FIGS. 3 and 5 is that the capacitor device, for example, may be fabricated between two layers of ceramic material. Conversely, and in the prior art, in order to achieve a capacitor device having an appropriate dielectric function, several layers of ceramic material had to be interposed between the first and second electrodes. Accordingly, the expense and difficulty of manufacturing a device was considerably greater using multiple layers of ceramic materials.

Finally, disposed over the layer of dielectric material 34 is a second electrode 36 in electrical communication with via 26. Electrode layer 36 is fabricated, like electrode layer 32, of a material such as silver. As may be appreciated from FIG. 5, electrode layer 32 is electrically coupled to via 26. Thus, by making electrical contact with vias 24 and 26, a charge may be applied and stored in the capacitor created by electrode layers 32, and 36 and having the dielectric paste 34 disposed therebetween.

As noted hereinabove, while FIGS. 3-5 illustrate the fabrication of a capacitor device within a multilayered ceramic module, the invention is not so limited. The dielectric paste material described in detail herein can be advantageously employed in a number of different circuit elements. Moreover, since the devices can be fabricated on a single layer, and since the required dielectric constant can be achieved by using the paste as opposed to multiple layers of ceramic material, both device size and costs are reduced as is manufacturing complexity of the multilayered ceramic modules.

EXAMPLES

A dielectric paste with the desired properties were achieved after a comprehensive formalization procedure, the details of which are delineated as examples hereinbelow.

Example One

Based upon the desired electrical and material characteristics discussed above, the following materials were purposely chosen as starting materials which would achieve a dielectric paste available for high frequency application.

A potash borosilicate glass was chosen as a glass constituent because of its basic compatibility with the commercially-available green ceramic tape composition.

A dielectric powder composition of $(SrCa)TiO_3$ was chosen as a starting ceramic powder. This composition was chosen because of its high dielectric constant (K) value in the range of approximately 250. The organic binder used was a mixture of 100 g of alpha terpineol and 5 g ethyl cellulose. This organic binder was chosen because it is common in the screen printing industry.

The first sample contained 4.13 grams of a solvent, specifically alpha terpinol, 0.40 grams of Emrol dispersant, 15.00 grams of $(SrCa)TiO3$, 5.22 grams of the organic binder, and 4.0 grams of crystallizable glass, specifically Schott 8250 glass. These materials were then processed as follows:

First, the organic binder system was mixed. Thereafter, the solvents and plasticizers were generally weighed into a glass beakers and heated to approximately 50° C. to facilitate dissolution. Next, the solvents were mixed in an air mixer for the purpose of dispersing them. The binder was then dissolved into the solvent. The time and temperature for dissolving the binder into the solvent was approximately 50°-60° C. for a period of time of approximately 30 minutes. These parameters were chosen in order to enhance the solution of the binder without excess loss due to evaporation. In this Example 1, the time was specifically 30 minutes.

The finished organic binder was cooled and stored for at least 24 hours prior to mixing with the dielectric powder and the crystallizable glass. This is because the binder is too hot to use after it is mixed The dielectric paste composition was made by weighing out the crystallizable glass and the dielectric powder in a mortar and pestle. Solvent maybe added to "wet" the powders.

Thereafter, the organic binder was weighed out and mixed to the crystallizable glass and dielectric powder mixture. This was then further mixed using the mortar and pestle. Once the system was mixed to a point of visual uniformity, the mixture was transferred from the mortar and pestle to a three-roll mill for mixing. The finished composition is stored in glass jars, and slowly rolled on a jar roller to prevent separation or viscosity changes until it is screen printed onto the ceramic green tape composition.

The resulting dielectric paste was then tested for conformance with desired processing capabilities and electrical properties. An actual test device in the form of a capacitor was then made by first printing a silver thick film pattern. This pattern consisted of a ground pad in the shape of a square which was placed onto the green unfired ceramic tape. A test lead was then formed using the vertically connected vias in the multilayer package which connected to test points on the outer surface of the multilayer package. Once the test capacitor was printed and laminated between multiple sheets of dielectric tape, electrical properties were tested. After the silver thick film was dried, a layer of dielectric paste was then printed on top of the silver layer. After drying the dielectric paste layer at between 70°-110° C. for 10-15 minutes, a second silver layer was then screen printed and dried under the same conditions as the first silver layer.

Next, the entire package consisting of the substrate, and the dielectric layer sandwiched between the two thick film silver layers were sintered at a peak temperature of 850° C. for approximately 30 minutes. The finished package was then tested in order to determine the actual electrical capacitance of the component.

The test results showed that the substrate resulting had camber, and there was little reaction between the (Sr, Ca) $TiO_3$ and glass in the original starting materials after firing resulting in low dielectric K and Q. It was theorized that by changing the glass composition, desirable properties could be achieved.

Example Two

Based upon the results of the previous example and experimentation, the following materials were purposefully chosen as starting materials which would best achieve a dielectric paste with the desired properties:

4.13 grams of solvent were added with 0.40 grams of dispersant, both as in Example One. 3.00 grams of (SrCa) $TiO_3$ powder, 6 grams of $Al_2O_3$, 21.18 grams of the organic binder, and 9.00 grams of a crystallizable glass, specifically Ca-Pb-borosilicate glass were then added. These materials were processed in the same manner as was described in Example One.

The test results showed that although this dielectric paste printed and fired very well, the measured dielectric constant (K) proved to be too low because too much of the crystallizable glass remained in the system. It was theorized by continuing to adjust the ceramic powder to crystallizable glass ratio such that the crystallizable glass content was less, an acceptable paste with desired K could be achieved.

Example Three

Based upon the results of the previous example and experimentation, the following materials were purposefully chosen as starting materials which would best achieve a dielectric paste with the desired properties:

4.13 grams of solvent were added to 0.40 grams of dispersant, 14.00 grams of (SrCa)TiO$_3$ powder, 21.18 grams of the organic binder, and 6.00 grams Ca-Pb-borosilicate glass. The subject ratio between the dielectric powder and glass was 70:30. These materials were processed in the same manner as was described in Example One.

The test results showed that this dielectric paste did not densify properly when fired to 850° C. because there was not enough crystallizable glass present in the system. It was theorized that by increasing the glass content, the solvent content, and the organic binder content, an acceptable paste could be achieved.

Example Four 5.00 grams of solvent were added with 0.40 grams of dispersant, 14.00 grams of (SrCa)TiO$_3$ powder, 25.00 grams of the organic binder, and 14.00 grams of a crystallizable glass, specifically Ca-Pb-borosilicate glass. The weight ratio was 50:50 dielectric powder to glass. These materials were processed in the same manner as described hereinabove with respect to example one.

The test results showed that the rheology was not optimized as was evidenced by the fact that pinholes appeared in the printed paste.

Example Five 4.13 grams of solvent were added to 0.40 grams of dispersant, 10.20 grams of (SrCa)TiO3 powder, 21.18 grams of the organic binder, and 6.8 grams of glass specifically Ca-Pb-borosilicate glass to prepare this sample. The particle size of the solid portion was about 2 μm. The weight ratio between the dielectric powder and glass was changed to 60:40. These materials were processed in the same manner as was described in Example One.

The test results showed that this dielectric paste screen printed very well and the package fired appropriately at 850° C. This sample had an electrical Q value of 500, and K of 23, which was within the acceptable range.

Example Six 4.14 grams of solvent were added to 0.40 grams of dispersant, 10.21 grams of (SrCa)TiO$_3$ powder, 21.90 grams of the organic binder, and 6.81 grams of crystallizable glass, specifically Ca-Pb-borosilicate glass. The weight ratio of dielectric portion to glass was 60:40. The particle size of the solids was increased to 4 μm. The electrical properties of the fields resulted in the material that had K of 28 and Q of 300.

Example Seven 4.14 grams of solvent were added to 0.40 grams of dispersant, 11.10 grams of (SrCa)TiO3 powder, 21.90 grams of the organic binder, and 5.92 grams of crystallizable glass, specifically Ca-Pb-borosilicate glass. The particle size was reduced to 1 μm and the weight ratio between the dielectric powder and glass was 65:35. These materials were processed in the same manner as was described in Example One.

The test results showed that this formulation produced a dielectric paste which exhibited reduced porosity due to reduced the large particle size. The electrical properties of the material proved to be adequate with K of 21, and Q 560.

Example Eight 9.94 grams of solvent were added with 0.82 grams of dispersant, 32.5 grams of (SrCa)TiO3 powder, 9.00 grams of the organic binder, and 17.54 grams of crystallizable glass, specifically Ca-Pb-borosilicate glass. These materials and the processing were the same as described in Example Seven.

Example Eight contained the same starting materials ratio as Sample Seven, however, the organic vehicle contact had been reduced. This resulted in a rather thick paste with adequate printability. All of the electrical and mechanical properties were within desired ranges, specifically K of 21.4 and Q of 560. The test results showed that this formulation was the most successful of all the samples, and resulted in a formulation which could be used in production.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A multiphase dielectric paste for multilayered ceramic devices, comprising: a (SrCa)TiO$_3$ dielectric powder and a crystallizable Ca-Pb-borosillicate glass having a weight ratio of about 65:35 and having a particle size of about 1 micron and having a dielectric constant (K) of about 21 and an electrical Q of at least about 560.

2. A multiphase dielectric paste as in claim 1, further comprising a solvent selected from at least one of the group consisting of alpha-terpineol, ester alcohol, diethylene glycol monobutyl ethyl, beta terpineol, and isopropanol.

3. A multiphase dielectric paste as in claim 1, further comprising a dispersant selected from at least one of the group consisting of methyl quantanary of propoxylated diethylethanolamine and lipophilic acid neutralized complex amines.

4. A multiphase dielectric paste as in claim 1, further comprising an organic binder having a polymer selected from at least one of the group consisting of ethyl cellulose, methyl cellulose, and nitro cellulose.

* * * * *